(12) United States Patent
Tishin et al.

(10) Patent No.: US 7,400,022 B2
(45) Date of Patent: Jul. 15, 2008

(54) PHOTORECEIVER CELL WITH COLOR SEPARATION

(75) Inventors: Yuriy Ivanovitch Tishin, Moscow (RU); Victor Alexandrovitch Gergel, Moscow (RU); Vladimir Alexandrovitch Zimoglyad, Moscow (RU); Igor Valerievitch Vanushin, Moscow (RU); Andrey Vladimirovitch Lependin, Moscow (RU)

(73) Assignee: Unique IC's, Moscow (RU)

( * ) Notice: Subject to any disclaimer, the term of this patent is extended or adjusted under 35 U.S.C. 154(b) by 224 days.

(21) Appl. No.: 10/561,026

(22) PCT Filed: Dec. 17, 2004

(86) PCT No.: PCT/RU2004/000510

§ 371 (c)(1),
(2), (4) Date: Dec. 16, 2005

(65) Prior Publication Data

US 2007/0102778 A1    May 10, 2007

(51) Int. Cl.
*H01L 31/062* (2006.01)
(52) U.S. Cl. .................. 257/440; 257/461; 257/464; 257/294; 257/233; 257/E27.134
(58) Field of Classification Search .......... 257/E27.134, 257/E27.135, 440, 461, 464, 294
See application file for complete search history.

(56) References Cited

U.S. PATENT DOCUMENTS

| 4,309,604 | A | 1/1982 | Yoshikawa et al. |
| 4,677,289 | A | 6/1987 | Nozaki |
| 5,965,875 | A | 10/1999 | Merrill |
| 6,894,265 | B2 * | 5/2005 | Merrill et al. ............ 250/208.1 |
| 7,132,724 | B1 * | 11/2006 | Merrill ....................... 257/440 |
| 2002/0058353 | A1 * | 5/2002 | Merrill ........................ 438/57 |

* cited by examiner

*Primary Examiner*—Cuong Q Nguyen
*Assistant Examiner*—Tran Q Tran
(74) *Attorney, Agent, or Firm*—MacPherson Kwok Chen & Heid LLP; Michael Shenker

(57) ABSTRACT

A photoreceiver cell with separation of color components of light incident to its surface, formed in a silicon substrate of the conductivity of the first type with an ohmic contact and comprising: the first, second and third regions, which have mutual positioning and configuration, which provide formation of the first and the second channels for diffusion of the secondary charge carriers generated in the substrate regions located under the first and the second potential barriers to the first and the third p-n junctions respectively; in this case, the length of the channels does not exceed the diffusion length of the secondary charge carriers.

A technical result of the present invention is an increase in spatial resolution of the projected image and its dynamic range.

Another technical result of the present invention is a decrease in the photo-cell area.

A photoreceiver cell with color separation may find broad application in multielement photoreceivers for video cameras and digital cameras.

13 Claims, 3 Drawing Sheets

PHOTORECEIVER CELL WITH COLOR SEPARATION

The present invention relates to microelectronics, and more specifically, to fabrication of integrated multielement photoreceivers, for example, for video cameras and digital photography.

Photoreceiver cells for integrated multielement photoreceivers are known, which are fabricated in the form of photodiodes (1) intended for capturing images in the entire visible band of wavelengths.

A disadvantage of such photoreceiver cells lies in their inability to detect light beam components with different wavelengths, which necessitates the usage of color filters, which are external with respect to the actual cells.

Photoreceiver cells capable of photosensitive cell separating the incident light colors are also known, which contain the regions in photosensitive cells silicon substrate with the conductivity of the first type, which form p-n junctions for separating charge carriers generated by different light beam components from an image element projected onto the cell surface (2).

Photocells with color separation (3) are known comprising the first and the second p-n junctions in a silicon substrate, which are positioned at a different distance from the surface coated with a layer of silicon dioxide.

Described technical decision is the closest to the claimed one in terms of the technical essence and is selected as a prototype.

Known photoreceiver cells have the following essential disadvantages:
  relatively low spatial resolution of a projected onto a photoreceiver image;
  a large number of photosensing elements necessary for capturing a three-component signal conveying information about color, and subsequently, a large area occupied by a photocell on the crystal of an integrated photoreceiver.

A technical result of the present invention is an increase in spatial resolution of the projected image and its dynamic range.

Another technical result of the present invention is a reduction in a photocell area.

These technical results were achieved in a photosensitive cell with separation of the color components of light incident onto its surface formed in a silicon substrate with the conductivity of the first type with ohmic contact, which comprises:
  a first region of the conductivity of the second type located in the near-surface layer of the substrate, divided into the first, second and third portions by the regions of silicon dioxide, which are equipped with the first, second and third ohmic contacts and form the first, second and third p-n junctions with the substrate;
  a second heavily-doped region having the same conductivity type as the substrate located under the said first region, which forms a first potential barrier for the charge carriers generated in the substrate region under the first barrier;
  a third heavily-doped region having the same conductivity type as the substrate located under said second heavily-doped region, which forms a second potential barrier for charge carriers generated in the substrate region under the second barrier;
  a fourth heavily-doped region having the same conductivity type as the substrate located under said third heavily-doped region, which forms a third potential barrier for charge carriers generated in the substrate region under the third barrier;
  said second, third and fourth heavily-doped regions have relative positioning and configuration, which provide formation of the first and second channels for diffusion of the secondary charge carriers generated in the substrate regions located under the first and the second potential barriers to the first and the third p-n junctions respectively; in addition, the length of the channels does not exceed the diffusion length of the secondary charge carriers;
  said first, second and third ohmic contacts are connected to the output of the photosensitive cell and the positive pole of the voltage source, whose negative pole is connected to the substrate via an ohmic contact.

The photosensitive cell with color separation according to the present invention is illustrated by the following drawings.

FIG. 2-FIG. 6 illustrate one of the possible methods of fabrication of a photosensitive cell with color separation according to the present invention.

Figure 1:
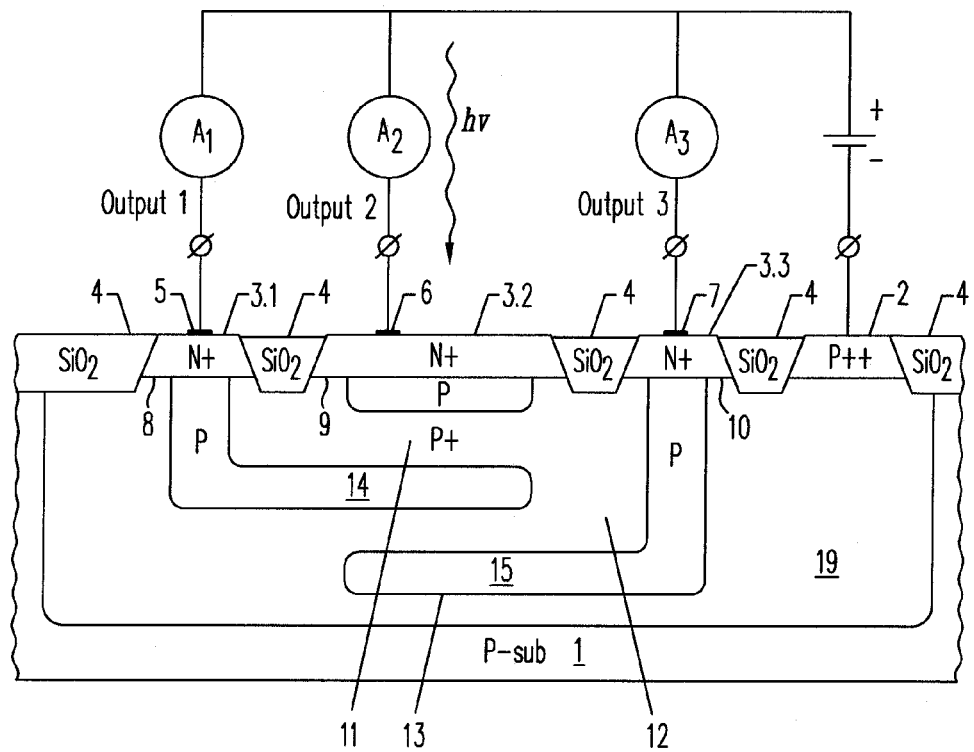
FIG. 1 represents a schematic sectional drawing illustrating an integrated structure of a photosensitive cell according to the present invention.
Figure 2:
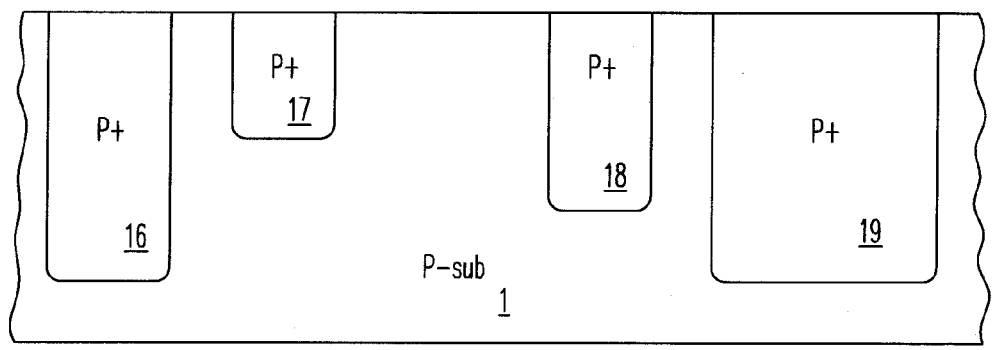
FIG. 2 represents a schematic sectional drawing illustrating an integrated structure of a photosensitive cell according to the present invention during its fabrication process after the operation of forming lateral $p^+$-regions by boron implantation.
Figure 3:
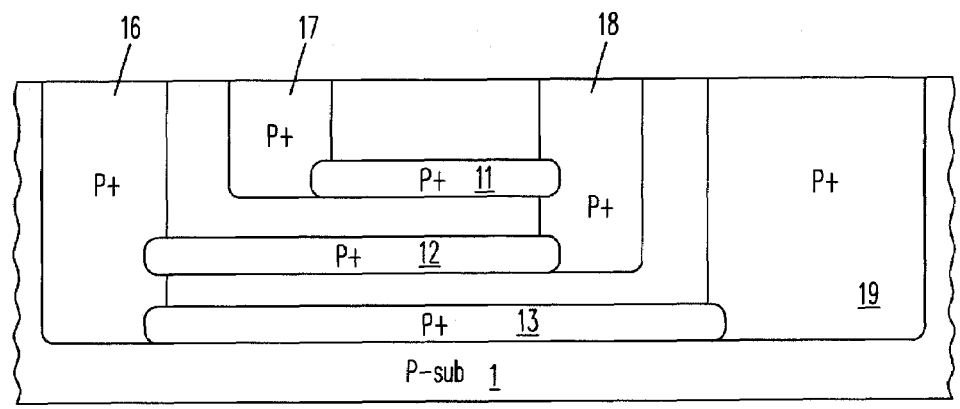
FIG. 3 represents a schematic sectional drawing illustrating an integrated structure of a photosensitive cell according to the present invention during its fabrication process after forming vertical $p^+$-regions in the substrate by implantation of boron atoms with various energy.
Figure 4:
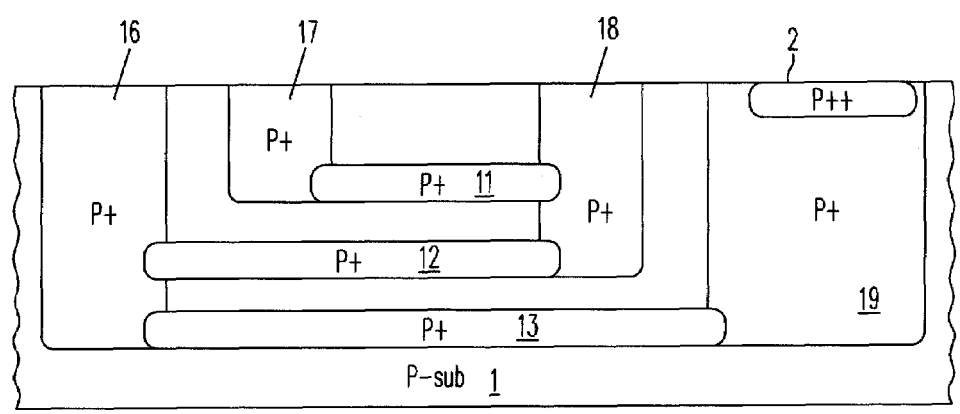
FIG. 4 represents a schematic sectional drawing illustrating an integrated structure of a photosensitive cell according to the present invention during its fabrication process after forming near-surface contact $p^{++}$-regions.
Figure 5:
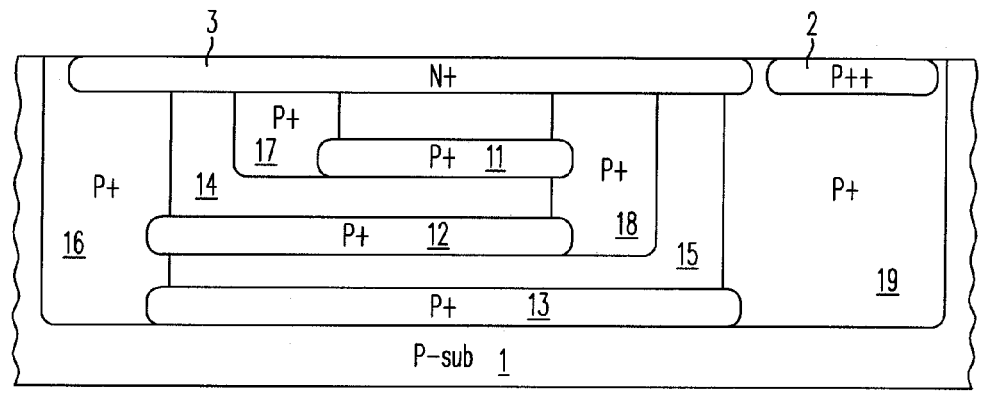
FIG. 5 represents a schematic sectional drawing illustrating an integrated structure of a photosensitive cell according to the present invention during its fabrication process after forming side dielectric isolation.
Figure 6:
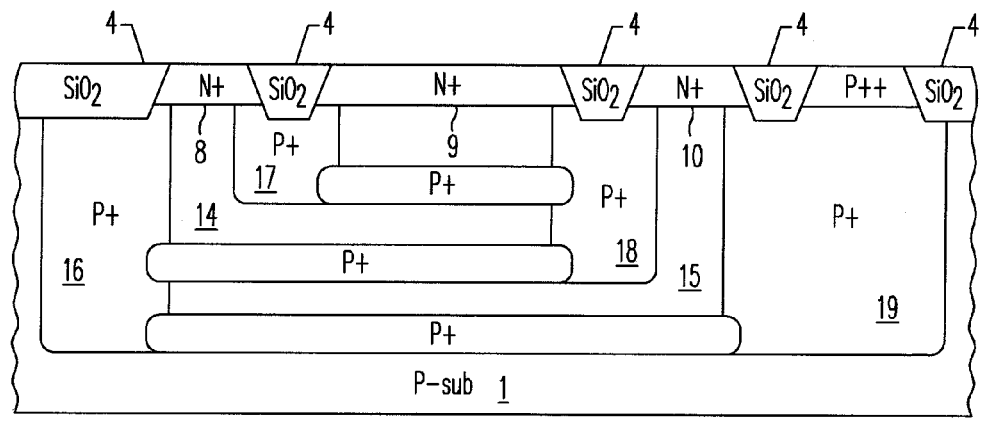

According to the present invention, a photosensitive cell with separation of color components of light incident to its surface is formed in a silicon substrate of the conductivity of the first type with an ohmic contact 2 and comprises:
  a first region of the conductivity of the second type located in a near-surface substrate layer, divided into a first 3.1, second 3.2 and third 3.3 portions by the regions of silicon dioxide 4, which are equipped with the first 5, second 6 and third 7 ohmic contacts and form the first 8, second 9 and third 10 p-n junctions with the substrate;
  a first heavily-doped region 11 having the same conductivity type as the substrate, located under said first region 3, which forms the first potential barrier for charge carriers generated in the substrate region 1 under the first barrier;
  a second heavily-doped region 12 having the same conductivity type as the substrate, located under said first heavily-doped region, which forms the second potential barrier for charge carriers generated in the substrate region under the second barrier;
  a third heavily-doped region 13 having the same conductivity type as the substrate 1, located under said second heavily-doped region, which forms the third potential barrier for charge carriers generated in the substrate region under the third barrier;

said first, second and third heavily-doped regions have relative positioning and configuration, which provide formation of the first 14 and the second channels 15 for diffusion of the secondary carriers generated in the substrate regions located under the first and the second potential barriers to the first 8 and the third 10 p-n junctions respectively; in addition, the length of the channels does not exceed the diffusion length of the secondary charge carriers;

said first 5, second 6 and third 7 ohmic contacts are connected respectively to the first, second and third outputs of the photosensitive cell, which are connected via the reading circuit to the positive pole of the voltage source, whose negative pole is connected via ohmic contact 2 to the substrate 1.

The photo-current reading circuits shown in FIG. 1 are denoted as A1, A2 and A3 and may be fabricated in the form of electronic circuits formed on the substrate 1 during the same process utilized for producing a photoreceiver cell.

Photoreceiver cells according to the present invention can be composed into a matrix of a super-sized integrated circuit of a multichannel integrated photoreceiver.

A photosensitive cell according to the present invention can be fabricated, for example, using a method illustrated in FIG. 2-FIG. 6.

The technological process of fabrication is based on a multiple usage of the ion implantation processes with subsequent activation annealing. The process may use the following technological operations:

1. Formation of retrograde-doping lateral-barrier p$^+$-regions (16, 17, 18 and 19) via boron implantation. The typical concentration of activated boron in these regions constitutes about $\sim 1 \times 10^{17} - 3 \times 10^{17}$ cm$^{-3}$.
2. Formation of vertical-barrier p$^+$-regions (11, 12, 13) in a p-substrate 1 by a single (for each region) boron implantation with boron atoms having corresponding energy. Thus, region 11 should be centered at a depth of approximately 0.4 um, region 12—at a depth of approximately 1.2 um, and region 13—at a depth of approximately 2.5 um. The typical concentration of activated boron in these regions also constitutes about $1 \times 10^{17} - 3 \times 10^{17}$ cm$^{-3}$.
3. Formation of the near-surface contact p$^{++}$-region 2 to the p-substrate 1 (FIG. 4).
4. Formation of the n$^+$-doped near-surface region 3 by arsenic implantation at a depth of about 0.2 um forming p-n junction (FIG. 5).
5. Division of the near-surface region 3 by the layer of silicon dioxide 4 into the first 3.1, second 3.2 and the third 3.3 portions, which form the first 8, second 9 and the third 10 p-n junctions with the substrate 1.

The above example does not limit all the possible methods of fabricating a photoreceiver cell with color separation according to the present invention.

A photoreceiver cell according to the present invention operates as follows.

A beam of light from an image element of a certain color corresponding to a certain spectral composition in the visible range of the optical spectrum is projected onto the surface of the photoreceiver cell. According to the known property of dispersion of the light absorption index in silicon, photons of different wavelengths, which compose the light beam, are respectively characterized by a different depth of fundamental absorption, caused by the electron-hole pair generation. In the proposed photoreceiver cell, which represents a monolithic ensemble of three n$^+$-p photodiodes 8, 9 and 10, whose photoactive p-regions are configured and isolated from each other by a connecting heavily-doped p$^+$-region formed by a certain sequence of ion implantations of corresponding doses and energy levels, which forms energy barriers between corresponding lightly-doped p-regions of these photodiodes: 8-14, 9-15, 10-16. In this case, photoelectrons are separated according to their generation site between the diode structures 8, 9 and 10, which in fact carries information about color of the photons that have generated them. Due to the presence of said barrier regions as well as readout p-n junctions, a potential profile is formed in the depth of the substrate under the photosensing region, which is necessary and sufficient to form diffusion fluxes of separated "color" components of the secondary carriers to different readout contacts, namely:

photogenerated carriers, generated above the first heavily-doped region 11 of the same conductivity type as the substrate, are accumulated at the readout region of the space charge of p-n junction 9. In this case, said barrier region 11 prevents interpenetration of photogenerated carriers between the channel 14 for diffusion of the secondary charge carriers and the readout region of spatial charge of p-n junction 9;

photogenerated carriers, generated below the first heavily-doped region 11 of the same conductivity type as the substrate and above the second heavily-doped region 12 of the same conductivity type as the substrate are accumulated at the readout region of space charge of p-n junction 8. In this case, said barrier region 12 prevents interpenetration of photogenerated carriers between the channels for diffusion of the secondary charge carriers 14 and 15;

photogenerated carriers generated below the second heavily-doped region 12 of the same conductivity type as the substrate and above the third heavily-doped region 13 of the same conductivity type as the substrate are accumulated at the readout region of the space charge of p-n junction 10. In this case, said barrier region 13 prevents interpenetration of the carriers photogenerated below the barrier region 13, which correspond to the infrared band of the optical spectrum, into the channel for diffusion of the secondary charge carriers 15;

lateral-barrier retrograde-doping p$^+$ regions (16, 17, 18 and 19) also prevent interpenetration of the photogenerated carriers between the diffusion channels and readout regions of the spatial charge of p-n junctions 8, 9, and 10.

Thus formed photo-current components corresponding to the spectral composition of light incident to the photo-cell surface are collected from outputs 1, 2 and 3 via contacts 5, 6 and 7 to the readout circuits A1, A2, A3. The readout circuits are external with respect to the photoreceiver cell and may be fabricated by known methods, for example, same as in the prototype case.

A photoreceiver cell with color separation may find broad application in multielement photoreceivers for video cameras and digital cameras.

Literature

1. U.S. Pat. No. 5,668,596, September, 1997.
2. U.S. Pat. No. 5,965,875, October, 1999.
3. Agilent Technologies HDCS Family of CMOS Image Sensors, Product Technical Specification HDCS-2020/1020// Imaging Electronics Division/Agilent Technologies, Inc./ Mar. 30, 2000.
4. High-speed CMOS Logic Data Book. Texas Instruments Ltd, 1991.
5. LVT Low Voltage Technology. Texas Instruments Ltd, 1992.

The invention claimed is:

1. A photoreceiver cell with separation of color components of light incident to its surface, formed in a silicon substrate of the conductivity of a first type with ohmic contact and comprising:

a first region of the conductivity of a second type, located in a near-surface substrate layer, which is divided into first, second and third portions by regions of silicon dioxide and equipped with first, second and third ohmic contacts, and which form first, second and third p-n junctions with the substrate;

a first heavily-doped region of the same conductivity type as the substrate, located under said first region of the conductivity of the second type, which forms a first potential barrier for charge carriers generated in a substrate region under the first barrier;

a second heavily-doped region of the same conductivity type as the substrate, located under said first heavily-doped region, which forms a second potential barrier for charge carriers generated in a substrate region under the second barrier;

a third heavily-doped region of the same conductivity type as the substrate, located under said second heavily-doped region, which forms a third potential barrier for charge carriers generated in a substrate region under the third barrier;

wherein said first, second and third heavily-doped regions have relative positioning and configuration to form first and second channels for diffusion of the secondary carriers generated in the substrate regions located under the first and the second potential barriers to the first and the third p-n junctions respectively, wherein the length of the channels does not exceed the diffusion length of the secondary charge carriers;

wherein said first, second and third ohmic contacts are connected to the first, second and third outputs of the photosensitive cell, which are connected via readout circuits to the positive pole of a voltage source, whose negative pole is connected to the substrate via an ohmic contact.

2. The photosensitive cell of claim 1, wherein the first and second channels have the first conductivity type but are not as heavily doped to the first conductivity type as the first, second and third heavily-doped regions.

3. A photoreceiver cell for generating electrical current responsive to light incident on a surface area of a semiconductor substrate from above the semiconductor substrate, the photoreceiver cell comprising:

a plurality of first regions of a first conductivity type in the semiconductor substrate, each first region being present underneath said surface area to receive the incident light and generate minority charge carriers in response to the incident light, wherein underneath said surface area, the first regions are spaced from each other and overlie one another;

one or more second regions of a second conductivity type opposite to the first conductivity type, each second region connected to the photoreceiver cell's output, wherein each first region forms a p-n junction with the one or more second regions;

wherein underneath said surface area, in at least one vertical cross section passing through said surface area, for at least two first regions $R_1$, $R_2$ in said plurality of the first regions, the semiconductor substrate's entire region which underlies the first region $R_1$ and overlies the first region $R_2$ has the first conductivity type but is heavier doped to the first conductivity type than the first regions $R_1$, $R_2$ underneath said surface area, said entire region providing a potential barrier to minority charge carriers formed in the first region $R_2$ when the p-n junctions formed by the first regions $R_1$, $R_2$ with the one or more second regions are reverse-biased.

4. The photoreceiver cell of claim 3, wherein the plurality of the first regions comprises at least three first regions $R_1$, $R_2$, ..., $R_n$ (n>2);

wherein underneath said surface area, in at least one vertical cross section passing through said surface area, for each two first regions $R_i$, $R_{i+1}$ (i=1, ..., n+1), the semiconductor substrate's entire region $r_i$ which underlies the first region $R_i$ and overlies the first region $R_{i+1}$ has the first conductivity type but is heavier doped to the first conductivity type than the first regions $R_i$, $R_{i+1}$ underneath said surface area, said entire region $r_i$ providing a potential barrier to minority charge carriers formed in the first region $R_{i+}$ when the p-n junctions formed by the first regions $R_i$, $R_{i+}$ with the one or more second regions are reverse-biased.

5. The photoreceiver cell of claim 4 wherein said entire regions $r_i$ are part of a continuous region having the first conductivity type and being heavier doped to the first conductivity type than any one of the first regions.

6. The photoreceiver cell of claim 3 wherein at least one of the first regions extends from underneath another one of the first regions underneath the surface area to one of said p-n junctions which is adjacent to a top surface of the semiconductor substrate.

7. The photoreceiver cell of claim 3 wherein all said p-n junctions are adjacent to a top surface of the semiconductor substrate.

8. The photoreceiver cell of claim 3 further comprising circuitry for reverse-biasing the p-n junctions and for reading currents at the one or more second regions.

9. A photoreceiver cell for generating electrical current responsive to light incident on a surface area of a semiconductor substrate from above the semiconductor substrate, the photoreceiver cell comprising:

a plurality of first regions of a first conductivity type in the semiconductor substrate, each first region being present underneath said surface area to receive the incident light and generate minority charge carriers in response to the incident light, wherein underneath said surface area, the first regions overlie one another;

one or more second regions of a second conductivity type opposite to the first conductivity type, each second region connected to the photoreceiver cell's output, wherein each first region forms a p-n junction with the one or more second regions;

wherein underneath said surface area, for at least one first region R in said plurality of the first regions, the semiconductor substrate immediately below an entire lower boundary of the region R has the first conductivity type but is heavier doped to the first conductivity type than the first region R, to provide a potential barrier to minority charge carriers formed below the semiconductor substrate's region below the first region R when the p-n junction formed by the first region R with the one or more second regions is reverse-biased.

10. The photoreceiver cell of claim 9, wherein the semiconductor substrate immediately below an entire lower boundary of each first region has the first conductivity type but is heavier doped to the first conductivity type than the first region, to provide a potential barrier to minority charge carriers formed below the semiconductor substrate's region below the first region when the p-n junction formed by the first region with the one or more second regions is reverse-biased.

11. The photoreceiver cell of claim 10, wherein the plurality of the first regions comprises at least three first regions.

12. The photoreceiver cell of claim 9 wherein each said p-n junction is adjacent to a top surface of the semiconductor substrate, and at least one of the first regions extends from another one of the first regions underneath said surface area to one of said p-n junctions.

13. The photoreceiver cell of claim 12, wherein each said p-n junction is contacted by one of the first regions from below.

* * * * *